United States Patent
Bancod et al.

(10) Patent No.: US 8,338,229 B1
(45) Date of Patent: Dec. 25, 2012

(54) STACKABLE PLASMA CLEANED VIA PACKAGE AND METHOD

(75) Inventors: Ludovico E. Bancod, Chandler, AZ (US); Jin Seong Kim, Seoul (KR); Kurt Peter Wachtler, Richardson, TX (US)

(73) Assignees: Amkor Technology, Inc., Chandler, AZ (US); Texas Instruments Incorporated, Dallas, TX (US)

( * ) Notice: Subject to any disclaimer, the term of this patent is extended or adjusted under 35 U.S.C. 154(b) by 161 days.

(21) Appl. No.: 12/846,973

(22) Filed: Jul. 30, 2010

(51) Int. Cl.
*H01L 21/00* (2006.01)
(52) U.S. Cl. .................................................. 438/106
(58) Field of Classification Search .............. 257/678, 257/774, 738, E23.011; 438/474, 710, 690, 438/15, 106, 124
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |

(Continued)

FOREIGN PATENT DOCUMENTS

JP          05-109975          4/1993

(Continued)

OTHER PUBLICATIONS

Quirk et al., "Semiconductor manufacturing technology", 2001, Prentice-Hall, pp. 442-444, Figs. 16.11. and 16,12.*

(Continued)

*Primary Examiner* — A. Sefer
*Assistant Examiner* — Nikolay Yushin
(74) *Attorney, Agent, or Firm* — McKay and Hodgson, LLP; Serge J. Hodgson (57) ABSTRACT

A method of forming a stackable plasma cleaned via package includes forming interconnection balls on terminals. The interconnection balls are encapsulated in a package body, e.g., molding compound. Via apertures are formed through the package body to expose the interconnection balls, wherein a contamination is formed on the interconnection balls. The contamination is removed using a plasma cleaning process. By removing the contamination, robust reflow of the interconnection balls is insured thus maximizing yield. Further, the plasma cleaning process is a cost efficient high volume process with no adverse effect on package reliability.

15 Claims, 8 Drawing Sheets

U.S. PATENT DOCUMENTS

| | | | |
|---|---|---|---|
| 5,229,550 A | 7/1993 | Bindra et al. | |
| 5,239,448 A | 8/1993 | Perkins et al. | |
| 5,247,429 A | 9/1993 | Iwase et al. | |
| 5,250,843 A | 10/1993 | Eichelberger | |
| 5,278,726 A | 1/1994 | Bernardoni et al. | |
| 5,283,459 A | 2/1994 | Hirano et al. | |
| 5,353,498 A | 10/1994 | Fillion et al. | |
| 5,371,654 A | 12/1994 | Beaman et al. | |
| 5,379,191 A | 1/1995 | Carey et al. | |
| 5,404,044 A | 4/1995 | Booth et al. | |
| 5,463,253 A | 10/1995 | Waki et al. | |
| 5,474,957 A | 12/1995 | Urushima | |
| 5,474,958 A | 12/1995 | Djennas et al. | |
| 5,497,033 A | 3/1996 | Fillion et al. | |
| 5,508,938 A | 4/1996 | Wheeler | |
| 5,530,288 A | 6/1996 | Stone | |
| 5,531,020 A | 7/1996 | Durand et al. | |
| 5,546,654 A | 8/1996 | Wojnarowski et al. | |
| 5,574,309 A | 11/1996 | Papapietro et al. | |
| 5,581,498 A | 12/1996 | Ludwig et al. | |
| 5,582,858 A | 12/1996 | Adamopoulos et al. | |
| 5,616,422 A | 4/1997 | Ballard et al. | |
| 5,637,832 A | 6/1997 | Danner | |
| 5,674,785 A | 10/1997 | Akram et al. | |
| 5,719,749 A | 2/1998 | Stopperan | |
| 5,726,493 A | 3/1998 | Yamashita et al. | |
| 5,739,581 A | 4/1998 | Chillara | |
| 5,739,585 A | 4/1998 | Akram et al. | |
| 5,739,588 A | 4/1998 | Ishida et al. | |
| 5,742,479 A | 4/1998 | Asakura | |
| 5,774,340 A | 6/1998 | Chang et al. | |
| 5,784,259 A | 7/1998 | Asakura | |
| 5,798,014 A | 8/1998 | Weber | |
| 5,822,190 A | 10/1998 | Iwasaki | |
| 5,826,330 A | 10/1998 | Isoda et al. | |
| 5,835,355 A | 11/1998 | Dordi | |
| 5,847,453 A | 12/1998 | Uematsu et al. | |
| 5,883,425 A | 3/1999 | Kobayashi | |
| 5,894,108 A | 4/1999 | Mostafazadeh et al. | |
| 5,903,052 A | 5/1999 | Chen et al. | |
| 5,907,477 A | 5/1999 | Tuttle et al. | |
| 5,924,003 A | 7/1999 | Slocum | |
| 5,936,843 A | 8/1999 | Ohshima et al. | |
| 5,952,611 A | 9/1999 | Eng et al. | |
| 6,004,619 A | 12/1999 | Dippon et al. | |
| 6,013,948 A | 1/2000 | Akram et al. | |
| 6,021,564 A | 2/2000 | Hanson | |
| 6,028,364 A | 2/2000 | Ogino et al. | |
| 6,034,427 A | 3/2000 | Lan et al. | |
| 6,035,527 A | 3/2000 | Tamm | |
| 6,040,622 A | 3/2000 | Wallace | |
| 6,056,831 A * | 5/2000 | Egitto et al. | 148/241 |
| 6,060,778 A | 5/2000 | Jeong et al. | |
| 6,069,407 A | 5/2000 | Hamzehdoost | |
| 6,072,243 A | 6/2000 | Nakanishi | |
| 6,081,036 A | 6/2000 | Hirano et al. | |
| 6,119,338 A | 9/2000 | Wang et al. | |
| 6,122,171 A | 9/2000 | Akram et al. | |
| 6,127,833 A | 10/2000 | Wu et al. | |
| 6,160,705 A | 12/2000 | Stearns et al. | |
| 6,172,419 B1 | 1/2001 | Kinsman | |
| 6,175,087 B1 | 1/2001 | Keesler et al. | |
| 6,184,463 B1 | 2/2001 | Panchou et al. | |
| 6,194,250 B1 | 2/2001 | Melton et al. | |
| 6,204,453 B1 | 3/2001 | Fallon et al. | |
| 6,214,641 B1 | 4/2001 | Akram | |
| 6,235,554 B1 | 5/2001 | Akram et al. | |
| 6,239,485 B1 | 5/2001 | Peters et al. | |
| D445,096 S | 7/2001 | Wallace | |
| D446,525 S | 8/2001 | Okamoto et al. | |
| 6,274,821 B1 | 8/2001 | Echigo et al. | |
| 6,280,641 B1 | 8/2001 | Gaku et al. | |
| 6,316,285 B1 | 11/2001 | Jiang et al. | |
| 6,351,031 B1 | 2/2002 | Iijima et al. | |
| 6,353,999 B1 | 3/2002 | Cheng | |
| 6,365,975 B1 | 4/2002 | DiStefano et al. | |
| 6,376,906 B1 | 4/2002 | Asai et al. | |
| 6,392,160 B1 | 5/2002 | Andry et al. | |
| 6,395,578 B1 | 5/2002 | Shin et al. | |
| 6,405,431 B1 | 6/2002 | Shin et al. | |
| 6,406,942 B2 | 6/2002 | Honda | |
| 6,407,341 B1 | 6/2002 | Anstrom et al. | |
| 6,407,930 B1 | 6/2002 | Hsu | |
| 6,448,510 B1 | 9/2002 | Neftin et al. | |
| 6,451,509 B2 | 9/2002 | Keesler et al. | |
| 6,471,115 B1 * | 10/2002 | Ijuin et al. | 228/180.22 |
| 6,479,762 B2 | 11/2002 | Kusaka | |
| 6,497,943 B1 | 12/2002 | Jimarez et al. | |
| 6,517,995 B1 | 2/2003 | Jacobson et al. | |
| 6,534,391 B1 | 3/2003 | Huemoeller et al. | |
| 6,544,638 B2 | 4/2003 | Fischer et al. | |
| 6,586,682 B2 | 7/2003 | Strandberg | |
| 6,608,757 B1 | 8/2003 | Bhatt et al. | |
| 6,660,559 B1 | 12/2003 | Huemoeller et al. | |
| 6,715,204 B1 | 4/2004 | Tsukada et al. | |
| 6,727,645 B2 | 4/2004 | Tsujimura et al. | |
| 6,730,857 B2 | 5/2004 | Konrad et al. | |
| 6,734,542 B2 | 5/2004 | Nakatani et al. | |
| 6,740,964 B2 | 5/2004 | Sasaki | |
| 6,753,612 B2 | 6/2004 | Adae-Amoakoh et al. | |
| 6,774,748 B1 | 8/2004 | Ito et al. | |
| 6,787,443 B1 | 9/2004 | Boggs et al. | |
| 6,803,528 B1 | 10/2004 | Koyanagi | |
| 6,815,709 B2 | 11/2004 | Clothier et al. | |
| 6,815,739 B2 | 11/2004 | Huff et al. | |
| 6,838,776 B2 | 1/2005 | Leal et al. | |
| 6,888,240 B2 | 5/2005 | Towle et al. | |
| 6,919,514 B2 | 7/2005 | Konrad et al. | |
| 6,921,968 B2 | 7/2005 | Chung | |
| 6,921,975 B2 | 7/2005 | Leal et al. | |
| 6,931,726 B2 | 8/2005 | Boyko et al. | |
| 6,953,995 B2 | 10/2005 | Farnworth et al. | |
| 6,987,314 B1 | 1/2006 | Yoshida et al. | |
| 7,015,075 B2 | 3/2006 | Fay et al. | |
| 7,030,469 B2 | 4/2006 | Mahadevan et al. | |
| 7,081,661 B2 | 7/2006 | Takehara et al. | |
| 7,125,744 B2 | 10/2006 | Takehara et al. | |
| 7,185,426 B1 | 3/2007 | Hiner et al. | |
| 7,198,980 B2 | 4/2007 | Jiang et al. | |
| 7,242,081 B1 | 7/2007 | Lee | |
| 7,282,394 B2 | 10/2007 | Cho et al. | |
| 7,285,855 B2 | 10/2007 | Foong | |
| 7,345,361 B2 | 3/2008 | Mallik et al. | |
| 7,372,151 B1 | 5/2008 | Fan et al. | |
| 7,429,786 B2 | 9/2008 | Karnezos et al. | |
| 7,459,202 B2 | 12/2008 | Magera et al. | |
| 7,548,430 B1 | 6/2009 | Huemoeller et al. | |
| 7,550,857 B1 | 6/2009 | Longo et al. | |
| 7,633,765 B1 | 12/2009 | Scanlan et al. | |
| 7,671,457 B1 | 3/2010 | Hiner et al. | |
| 7,777,351 B1 | 8/2010 | Berry et al. | |
| 2002/0017712 A1 | 2/2002 | Bessho et al. | |
| 2002/0061642 A1 | 5/2002 | Haji et al. | |
| 2002/0066952 A1 | 6/2002 | Taniguchi et al. | |
| 2002/0195697 A1 | 12/2002 | Mess et al. | |
| 2003/0025199 A1 | 2/2003 | Wu et al. | |
| 2003/0128096 A1 | 7/2003 | Mazzochette | |
| 2003/0141582 A1 | 7/2003 | Yang et al. | |
| 2003/0197284 A1 | 10/2003 | Khiang et al. | |
| 2004/0063246 A1 | 4/2004 | Karnezos | |
| 2004/0145044 A1 | 7/2004 | Sugaya et al. | |
| 2004/0159462 A1 | 8/2004 | Chung | |
| 2005/0139985 A1 | 6/2005 | Takahashi | |
| 2005/0242425 A1 | 11/2005 | Leal et al. | |
| 2007/0273049 A1 | 11/2007 | Khan et al. | |
| 2007/0281471 A1 | 12/2007 | Hurwitz et al. | |
| 2007/0290376 A1 | 12/2007 | Zhao et al. | |
| 2008/0194056 A1 * | 8/2008 | Cain et al. | 438/99 |
| 2008/0230887 A1 | 9/2008 | Sun et al. | |
| 2008/0233755 A1 * | 9/2008 | Blais et al. | 438/710 |
| 2009/0230487 A1 * | 9/2009 | Saitoh et al. | 257/419 |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

IBM Technical Disclosure Bulletin, "Microstructure Solder Mask by Means of a Laser", vol. 36, Issue 11, p. 589, Nov. 1, 1993. (NN9311589).

Kim et al., "Application of Through Mold Via (TMV) as PoP base package", 58th *ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

"Direct Plasma Cleaner (VSP-88D)", 2 pages, Vision Semicon Co., Ltd., No author or date provided.

"PSX307: Model No. NM-EFP1A", *IC Assembly System Catalog*, Dec. 2009, 2 pages, Panasonic Factory Solutions Co., Ltd., No author provided.

Hiner et al., "Printed Wiring Motherboard Having Bonded Interconnect Redistribution Mesa", U.S. Appl. No. 10/992,371, filed on Nov. 18, 2004.

Huemoeller et al., "Build Up Motherboard Fabrication Method and Structure", U.S. Appl. No. 11/824,395, filed Jun. 29, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

Darveaux et al., "Stackable Treated Via Package and Method", U.S. Appl. No. 12/787,238, filed May 25, 2010.

\* cited by examiner

STACKABLE PLASMA CLEANED VIA PACKAGE AND METHOD

TECHNICAL FIELD

The present application relates to the field of electronics, and more particularly, to methods of forming electronic component packages and related structures.

BACKGROUND

To form a stacked electronic component assembly, a stacked electronic component is mounted to a lower electronic component package. Failure in the solder interconnections between the stacked electronic component and the lower electronic component package can occur during solder reflow. Failure of the solder interconnections requires rework or scraping of the stacked electronic component assembly.

BRIEF DESCRIPTION OF THE DRAWINGS

In the following description, the same or similar elements are labeled with the same or similar reference numbers.

DETAILED DESCRIPTION

Figure 2:
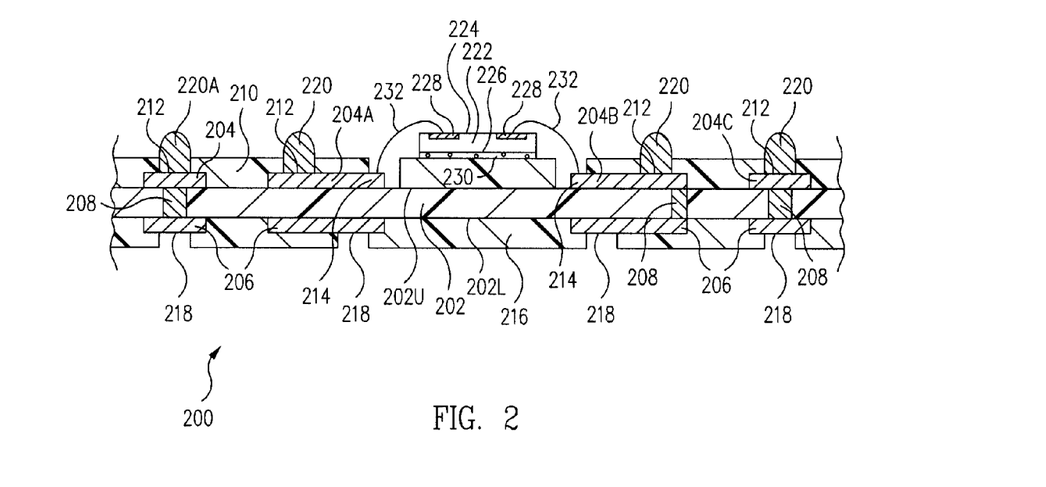
FIG. 2 is a cross-sectional view of a stackable plasma cleaned via package during fabrication in accordance with one embodiment.
Figure 3:
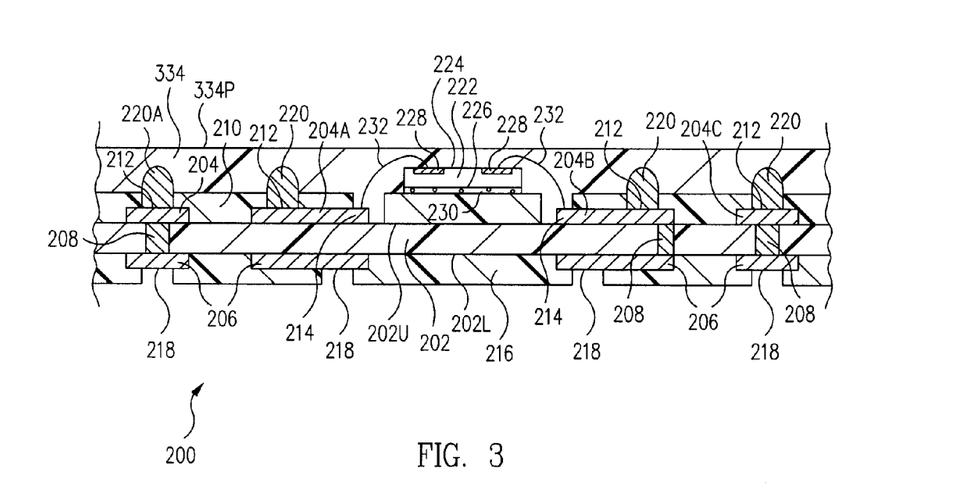
FIGS. 3, 4 are cross-sectional views of the stackable plasma cleaned via package of FIG. 2 at later stages during fabrication in accordance with various embodiments.
Figure 4:
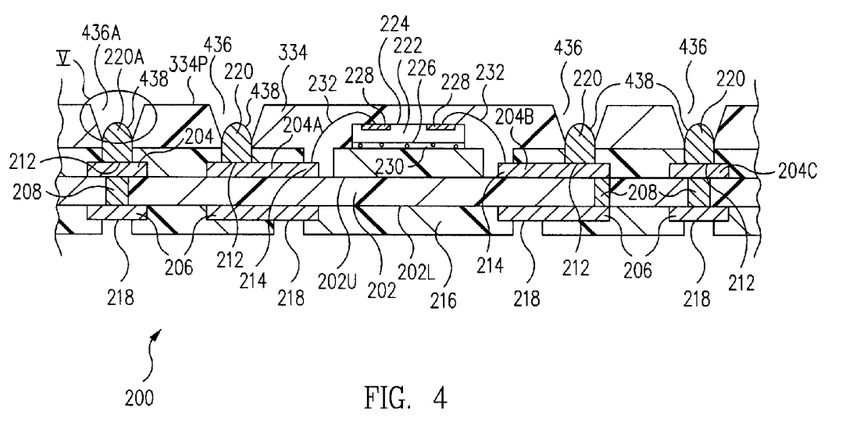
Figure 5:
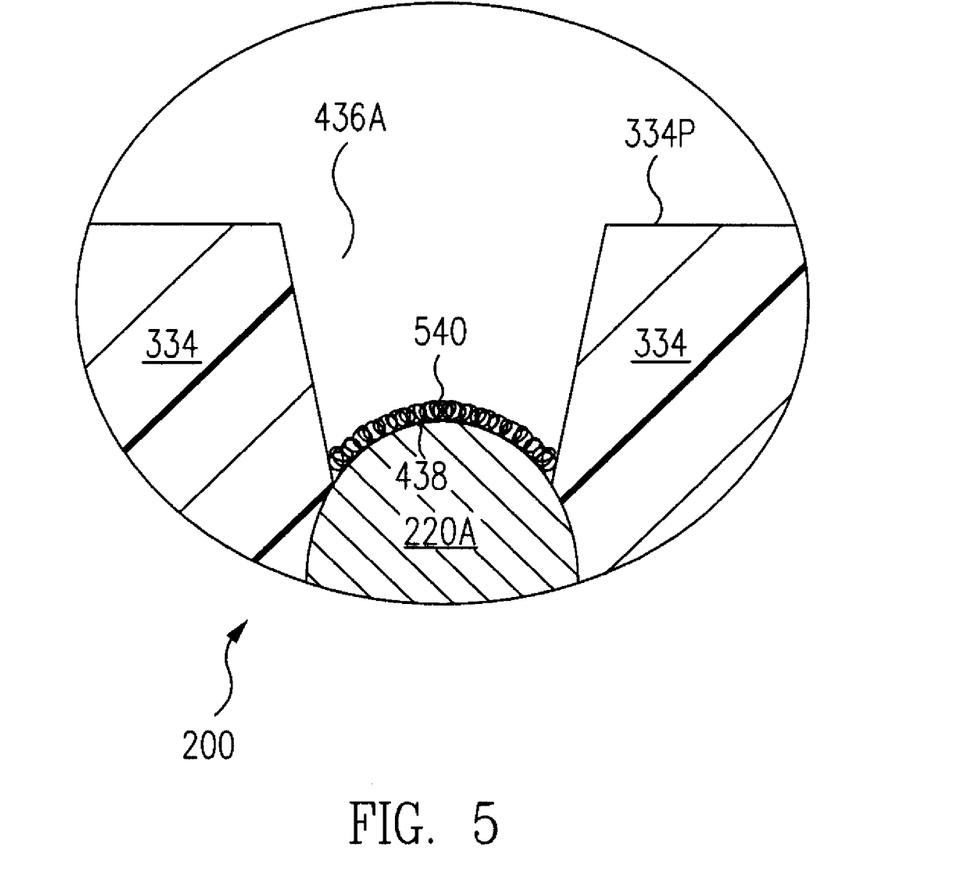
FIG. 5 is an enlarged cross-sectional view of the region V of the stackable plasma cleaned via package of FIG. 4 in accordance with one embodiment.

As an overview and in accordance with one embodiment, referring to FIG. 2, a stackable plasma cleaned via package formation method includes forming interconnection balls 220 on terminals 212. Referring now to FIG. 3, upper interconnection balls 220 are encapsulated in a package body 334, e.g., molding compound. Referring now to FIGS. 4 and 5 together, via apertures 436 are formed through package body 334 to expose interconnection balls 220, wherein a contamination 540 (FIG. 5) is formed on interconnection balls 220. Contamination 540 is removed using a plasma cleaning process. By removing contamination 540, robust reflow of interconnection balls 220 is insured thus maximizing yield. Further, the plasma cleaning process is a cost efficient high volume process with no adverse effect on package reliability.

Figure 1:
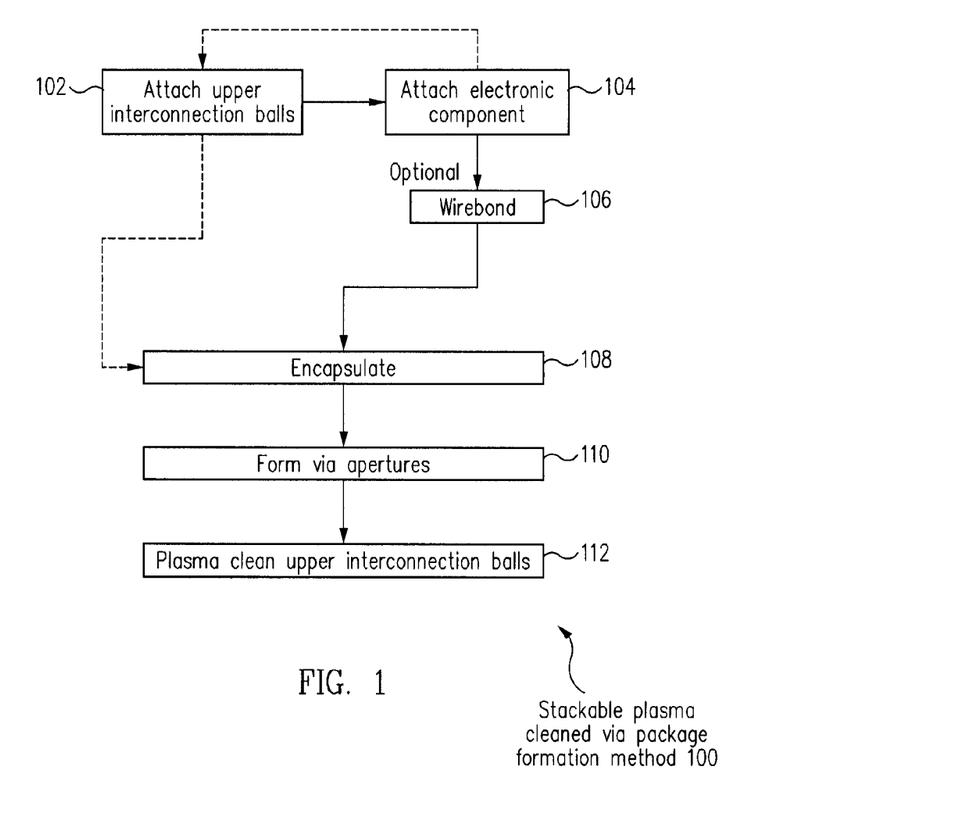
FIG. 1 is a block diagram of a stackable plasma cleaned via package formation method in accordance with one embodiment.

Now in more detail, FIG. 1 is a block diagram of a stackable plasma cleaned via package formation method 100 in accordance with one embodiment. FIG. 2 is a cross-sectional view of a stackable plasma cleaned via package 200 during fabrication in accordance with one embodiment. Paying particular attention to FIG. 2, stackable plasma cleaned via package 200, sometimes called an electronic component package, includes a substrate 202 including an upper, e.g., first, surface 202U and an opposite lower, e.g., second, surface 202L. Substrate 202 is a dielectric material such as laminate, ceramic, printed circuit board material, or other dielectric material.

Formed on upper surface 202U of substrate 202 are electrically conductive upper, e.g., first, traces 204, e.g., formed of copper. Formed on lower surface 202L of substrate 202 are lower, e.g., second, traces 206. Lower traces 206 are electrically connected to upper traces 204 by electrically conductive vias 208 extending through substrate 202 between upper surface 202U and lower surface 202L.

Stackable plasma cleaned via package 200 further includes an upper, e.g., first, solder mask 210 on upper surface 202U that protects first portions of upper traces 204 while exposing second portions, e.g., terminals 212 and/or bond fingers 214, of upper traces 204.

Stackable plasma cleaned via package 200 further includes a lower, e.g., second, solder mask 216 on lower surface 202L that protects first portions of lower traces 206 while exposing second portions, e.g., terminals 218, of lower traces 206.

Referring now to FIGS. 1 and 2 together, in an attach upper interconnection balls operation 102, electrically conductive upper, e.g., first, interconnection balls 220 are attached to terminals 212 of upper traces 204. Illustratively, upper interconnection balls 220 are formed of solder, i.e., are solder balls. In other embodiments, upper interconnection balls 220 are formed of other electrically conductive material such as plated copper or electrically conductive adhesive.

From attach upper interconnection balls operation 102, flow moves to an attach electronic component operation 104. In attach electronic component operation 104, an electronic component 222 is attached.

In one embodiment, electronic component 222 is an integrated circuit chip, e.g., an active component. However, in other embodiments, electronic component 222 is a passive component such as a capacitor, resistor, or inductor. In another embodiment, electronic component 222 is a prepackaged device. In yet another embodiment, a plurality of electronic components are mounted, e.g., in a stacked configuration.

In accordance with this embodiment, electronic component 222 includes an active surface 224 and an opposite inactive surface 226. Electronic component 222 further includes bond pads 228 formed on active surface 224.

Inactive surface 226 is mounted to upper solder mask 210 with an adhesive 230, sometimes called a die attach adhesive. In another embodiment, upper solder mask 210 is patterned to expose a portion of upper surface 202U of substrate 202 and inactive surface 226 is mounted to the exposed portion of upper surface 202U of substrate 202 with adhesive 230. Generally, electronic component 222 is mounted to substrate 202.

From attach electronic component operation 104, flow moves to a wirebond operation 106. In wirebond operation 106, bond pads 228 are electrically connected to upper traces 204, e.g., bond fingers 214 thereof, by electrically conductive bond wires 232.

Although electronic component 222 is illustrated and described as being mounted in a wirebond configuration, in other embodiments, electronic component 222 is mounted in a different configuration such as a flip chip configuration. In a flip chip configuration, flip chip bumps, e.g., solder, form the physical and electrical connections between bond pads 228 and upper traces 204, e.g., bond fingers 214 thereof, as discussed below in reference to FIG. 2A. Thus, wirebond operation 106 is optional, e.g., is not performed in the case when electronic component 222 is mounted in a flip chip configuration or other configuration not requiring bond wires 232.

Although a particular electrically conductive pathway between bond pads 228 and lower traces 206 is described above, other electrically conductive pathways can be formed. For example, contact metallizations can be formed between the various electrical conductors.

Further, instead of straight though vias 208, in one embodiment, substrate 202 is a multilayer substrate and a plurality of vias and/or internal traces form the electrical interconnection between upper traces 204 and lower traces 206.

In accordance with one embodiment, one or more of upper traces 204 is not electrically connected to lower traces 206, i.e., is electrically isolated from lower traces 206, and electrically connected to bond pads 228. To illustrate, a first upper trace 204A of the plurality of upper traces 204 is electrically isolated from lower traces 206 and electrically connected to a respective bond pad 228. In accordance with this embodiment, the respective bond pad 228 electrically connected to upper trace 204A is also electrically isolated from lower traces 206.

In accordance with one embodiment, one or more of upper traces 204 is electrically connected to both bond pads 228 and to lower traces 206. To illustrate, a second upper trace 204B of the plurality of upper traces 204 is electrically connected to lower trace(s) 206 by a via 208. In accordance with this embodiment, the respective bond pad 228 electrically connected to upper trace 204B is also electrically connected to lower trace(s) 206.

In accordance with one embodiment, one or more of upper traces 204 is not electrically connected to a bond pad 228, i.e., is electrically isolated from bond pads 228, and is electrically connected to lower traces 206. To illustrate, a third upper trace 204C is electrically isolated from bond pads 228 and electrically connected to lower trace(s) 206. In accordance with this embodiment, the respective lower trace(s) 206 electrically connected to upper trace 204C are also electrically isolated from bond pads 228.

As set forth above, in accordance with various embodiments, upper traces 204 are electrically connected to lower traces 206, to bond pads 228, and/or to lower traces 206 and bond pads 228. Thus, in accordance with various embodiments, upper interconnection balls 220 are electrically connected to lower traces 206 only, to bond pads 228 only, and/or to both lower traces 206 and bond pads 228.

Although various examples of connections between bond pads 228, upper traces 204, lower traces 206, and upper interconnection balls 220 are set forth above, in light of this disclosure, those of skill in the art will understand that any one of a number of electrical configurations are possible depending upon the particular application.

Figure 2A:
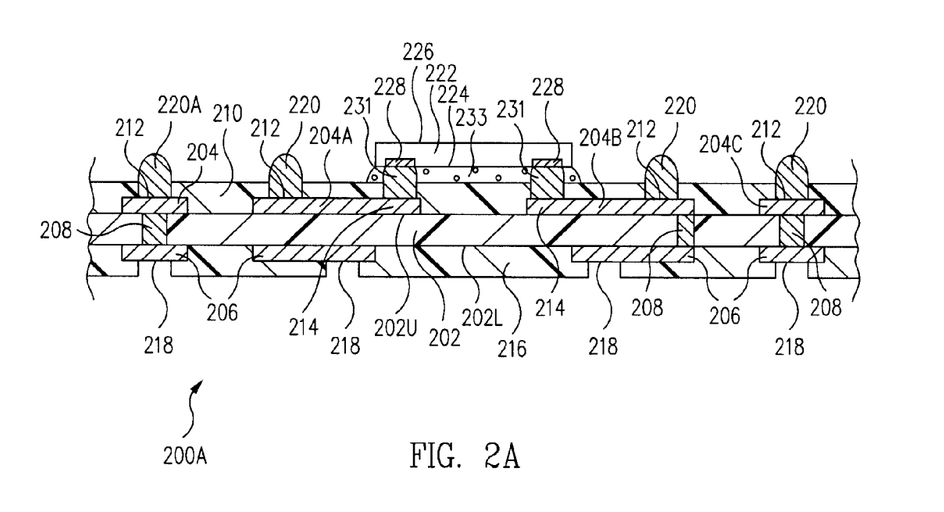
FIG. 2A is a cross-sectional view of a stackable plasma cleaned via package during fabrication in accordance with another embodiment.

FIG. 2A is a cross-sectional view of a stackable plasma cleaned via package 200A during fabrication in accordance with another embodiment. Stackable plasma cleaned via package 200A of FIG. 2A is similar to stackable plasma cleaned via package 200 of FIG. 2 and only the significant differences are discussed below.

Referring now to FIG. 2A, in accordance with this embodiment, electronic component 222 is mounted in a flip chip configuration. More particularly, flip chip bumps 231, e.g., solder, form the physical and electrical connections between bond pads 228 and upper traces 204, e.g., bond fingers 214 thereof. Optionally, an underfill 233 is applied between active surface 224 of electronic component 222 and upper solder mask 210 (or upper surface 202U of substrate 202) and encloses and protects flip chip bumps 231.

Referring now to FIGS. 1 and 2A together, in accordance with one embodiment as indicated by the dashed arrows in FIG. 1, attach electronic component operation 104 is performed prior to attach upper interconnection balls operation 102. Accordingly, electronic component 222 is flip chip mounted with flip chip bumps 231 first and then upper interconnection balls 220 are attached to terminals 212. Further, wirebond operation 106 is not performed and flow moves directly from attach upper interconnection balls operation 102 to an encapsulate operation 108.

In yet another embodiment, attach electronic component operation 104 is performed simultaneously with attach upper interconnection balls operation 102. Accordingly, upper interconnection balls 220 are attached to terminals 212 and electronic component 222 is flip chip mounted with flip chip bumps 231 simultaneously, e.g., in a single reflow operation. Further, wirebond operation 106 is not performed and flow moves directly from both attach upper interconnection balls operation 102 and attach electronic component operation 104 to encapsulate operation 108.

Although stackable plasma cleaned via package 200 of FIG. 2 is illustrated in the following figures, in light of this disclosure, those of skill in the art will understand that the operations can equally be performed with stackable plasma cleaned via package 200A of FIG. 2A.

FIG. 3 is a cross-sectional view of stackable plasma cleaned via package 200 of FIG. 2 at a later stage during fabrication in accordance with one embodiment. Referring now to FIGS. 1 and 3 together, from wirebond operation 106, flow moves to encapsulate operation 108. In encapsulate operation 108, electronic component 222, bond wires 232, upper interconnection balls 220, upper solder mask 210 and any exposed portions of upper surface 202U and/or upper traces 204 are enclosed, sometimes called encased, encapsulated, and/or covered, with a package body 334.

Illustratively, package body 334 is a cured liquid encapsulant, molding compound, or other dielectric material. Package body 334 protects electronic component 222, bond wires 232, upper interconnection balls 220, upper solder mask 210 and any exposed portions of upper surface 202U and/or upper traces 204 from the ambient environment, e.g., from contact, moisture and/or shorting to other structures.

Package body 334 includes a principal surface 334P parallel to upper surface 202U of substrate 202. Although the terms parallel, perpendicular, and similar terms are used herein, it is to be understood that the described features may not be exactly parallel and perpendicular, but only substantially parallel and perpendicular to within excepted manufacturing tolerances.

FIG. 4 is a cross-sectional view of stackable plasma cleaned via package 200 of FIG. 3 at a later stage during fabrication in accordance with one embodiment. Referring now to FIGS. 1 and 4 together, from encapsulate operation 108, flow moves to a form via apertures operation 110. In form via apertures operation 110, via apertures 436 are formed in package body 334.

Via apertures 436 penetrate into package body 334 from principal surface 334P to expose upper interconnection balls 220. Each via aperture 436 exposes a respective upper interconnection ball 220 on a respective terminal 212. More particularly, exposed surfaces 438 of upper interconnection balls 220 are exposed through via apertures 436 while the remaining portions of upper interconnection ball 220 remain enclosed within package body 334.

In one embodiment, via aperture 436 are formed using a laser-ablation process. More particularly, a laser is repeatedly directed at principal surface 334P perpendicularly to principal surface 334P. This laser ablates, i.e., removes, portions of package body 334 leaving via apertures 436, sometimes called through holes.

To further illustrate, a first via aperture 436A of the plurality of via apertures 436 extends between principal surface 334P of package body 334 and a first upper interconnection ball 220A of upper interconnection balls 220. Accordingly, upper interconnection ball 220A is exposed through via aperture 436A.

Via aperture 436A tapers from principal surface 334P to upper interconnection ball 220A. More particularly, the diameter of via aperture 436A in a plane parallel to principal surface 334P is greatest at the top of via aperture 436A, and smallest at the bottom of via aperture 436A and gradually diminishes between the top and bottom of via aperture 436A. The top of via aperture 436A is located at principal surface 334P and the bottom of via aperture 436 is located at upper interconnection ball 220A in this embodiment.

Although only a single via aperture 436A is described in detail, in light of this disclosure, those of skill in the art will understand that the description is equally applicable to all of via apertures 436.

FIG. 5 is an enlarged cross-sectional view of the region V of stackable plasma cleaned via package 200 of FIG. 4 in accordance with one embodiment. As illustrated in FIG. 5, the inventors have discovered that a contamination 540, e.g., a non-conductive contamination, exists upon exposed surfaces 438 of upper interconnection balls 220 after performance of form via apertures operation 110.

The inventors have discovered that contamination 540 is formed of the material of package body 334, e.g., molding compound. More particularly, it is believed that during the laser-ablation process used to form via apertures 436, the laser-ablated, i.e., removed, portion of package body 334 is redeposited on exposed surfaces 438 of upper interconnection balls 220 as contamination 540. Alternatively, or in addition, it is believed that during the laser-ablation process used to form via apertures 436, the portion of package body 334 above exposed surfaces 438 of upper interconnection balls 220 is not completely removed and thus remains as contamination 540.

Regardless of the mechanism for formation of contamination 540, the inventors have discovered that contamination 540 can interfere with reflow of upper interconnection balls 220 with lower interconnection balls of an upper electronic component package stacked upon stackable plasma cleaned via package 200. For example, contamination 540 can cause non-wetting of solder joints during SMT (Surface Mounting Technology) of another electronic component. More particularly, contamination 540 can inhibit intermixing of upper interconnection balls 220 with lower interconnection balls of an upper electronic component package stacked upon stackable plasma cleaned via package 200. Generally, contamination 540 can result in the formation of open circuits during reflow thus deceasing yield.

Accordingly, from form via apertures operation 110, flow moves to a plasma clean upper interconnection balls operation 112. In plasma clean upper interconnection balls operation 112, upper interconnection balls 220 are plasma cleaned to remove contamination 540 as discussed in greater detail below with reference to FIG. 6.

Figure 6:
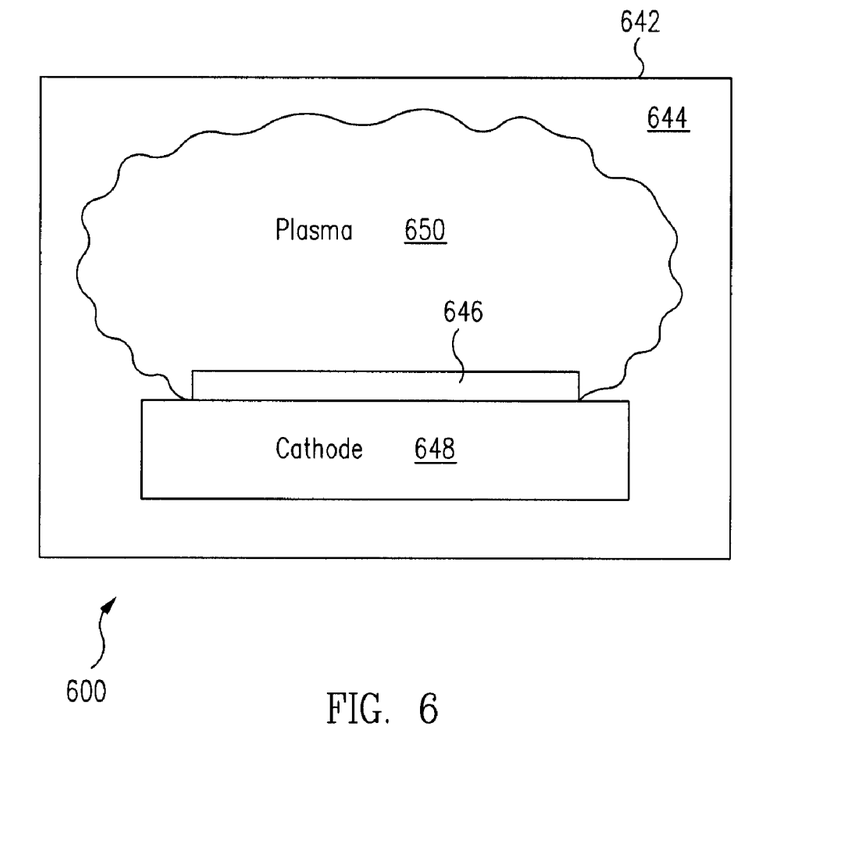
FIG. 6 is a schematic diagram of a plasma cleaning apparatus in accordance with one embodiment.

FIG. 6 is a schematic diagram of a plasma cleaning apparatus 600 in accordance with one embodiment. Plasma cleaning apparatus 600 includes a reactor chamber 642 that defines a reactor volume 644. Referring now to FIGS. 1, 4, 5, and 6 together, in plasma clean upper interconnection balls operation 112, a substrate 646 is placed within reactor volume 644 and on a cathode 648 in accordance with this embodiment.

Illustratively, stackable plasma cleaned via package 200 is formed simultaneously with a plurality of stackable plasma cleaned via packages 200 in an array or strip which is later singulated. The array or strip is represented as substrate 646 in FIG. 6. However, in another embodiment, instead of being an array or strip of stackable plasma cleaned via packages 200, substrate 646 is a single stackable plasma cleaned via package 200.

In one embodiment, reactor volume 644 is evacuated, e.g., with a vacuum pump, to a subatmospheric pressure. However, in another embodiment, reactor volume 644 remains at atmospheric pressure.

In either case, process gas is introduced into reactor volume 644. Power, e.g., RF or AC power, is coupled to cathode 648 which operates as an electrode. The coupled power generates a plasma 650, which includes activated atoms and ions for example. Substrate 646 is located within plasma 650.

Substrate 646 is cleaned by plasma 650 to remove contamination 540. In one embodiment, the plasma activated atoms and ions travel through via apertures 436 to strike and/or react with contamination 540 to volatilize contamination 540. The volatilized contamination 540 is evacuated from reactor chamber 642 during processing, e.g., with a vacuum pump.

Of importance, the plasma cleaning process is a cost efficient high volume process with no adverse effect on package reliability.

In one specific embodiment, the process gas is Argon only, the power is a minimum of 500 watts, and the plasma cleaning time is 1, 3, or 5 minutes, although other plasma cleaning process parameters are used in other embodiments. For example, in another embodiment, the process gas is Argon and Oxygen to provide a mechanical and chemical cleaning of upper interconnection balls 220. In yet another example, the power is less than 500 watts.

Suitable plasma cleaners include: (1) Panasonic's plasma cleaner model ID number PSX307, model number NM-EFP1A available from Panasonic Factory Solutions Co., Ltd., 1375 Kamisukiawara, Showa-cho, Nakakoma-gun, Yamanashi 409-3895, Japan; and (2) Vision Semicon's direct plasma cleaner VSP-88D available from Vision Semicon Co. Ltd., #839, Tamnip-Dong, Yuseong-Gu, Daejeon Metropolitan-City, Korea. Although two examples are provided, in light of this disclosure, those of skill in the art will understand that other plasma cleaners are used in other embodiments.

Figure 7:
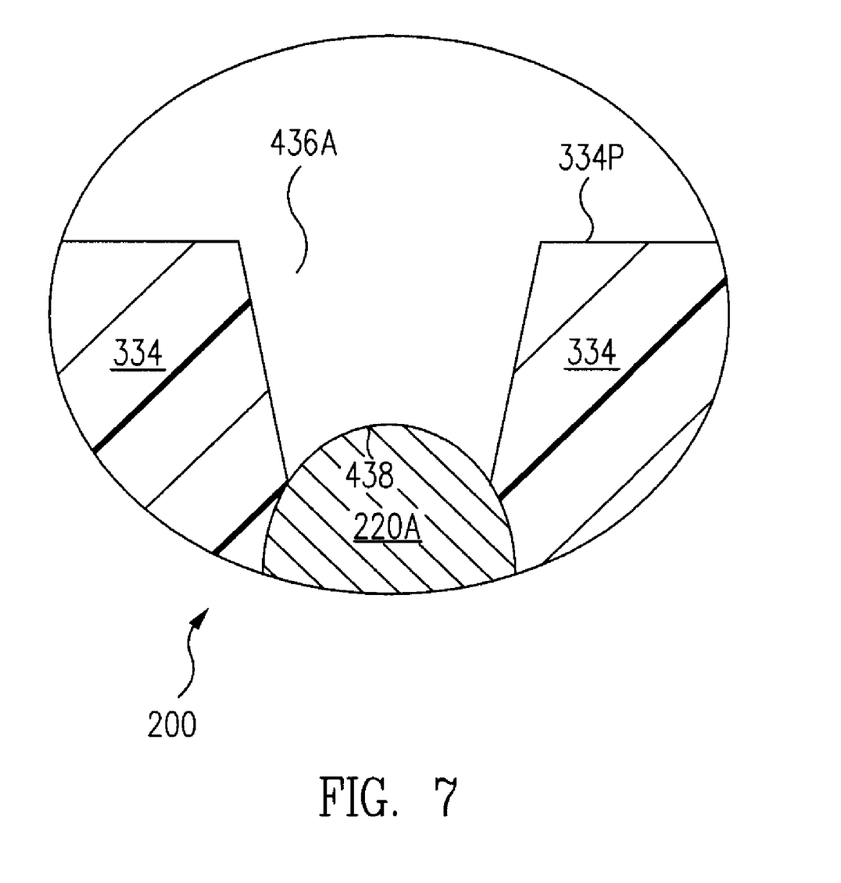
FIG. 7 is a cross-sectional view of the region V of the stackable plasma cleaned via package of FIG. 4 after performance of a plasma clean upper interconnection balls operation in accordance with one embodiment.

FIG. 7 is a cross-sectional view of the region V of stackable plasma cleaned via package 200 of FIG. 4 after performance of plasma clean upper interconnection balls operation 112 in accordance with one embodiment. Referring now to FIGS. 4, 5, and 7 together, contamination 540 has been removed from exposed surfaces 438 of upper interconnection balls 220. After performance of plasma clean upper interconnection balls operation 112, exposed surfaces 438 of upper interconnection balls 220 are sometimes called plasma cleaned surfaces 438. Plasma cleaned surfaces 438 have little or no contamination 540, e.g., have an absence of contamination 540, and the grain structure of upper interconnection balls 220 is reduced or eliminated.

By removing contamination 540, robust reflow of upper interconnection balls 220 with lower interconnection balls of an upper electronic component package stacked upon stackable plasma cleaned via package 200 is insured. More particularly, robust intermixing of upper interconnection balls 220 with lower interconnection balls of an upper electronic component package stacked upon stackable plasma cleaned via package 200 is insured thus maximizing yield.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A method comprising:
   forming an interconnection ball coupled to a terminal;
   encapsulating the interconnection ball in a package body;
   forming a via aperture through the package body to expose the interconnection ball; and
   plasma cleaning the interconnection ball comprising removing a contamination from the interconnection ball, the contamination comprising material of the package body.

2. The method of claim 1 wherein an exposed surface of the interconnection ball is exposed through the via aperture, the contamination being on the exposed surface.

3. The method of claim 1 wherein the contamination comprises a non-conductive contamination.

4. The method of claim 1 wherein the contamination comprises molding compound.

5. The method of claim 1 wherein a process gas used during the plasma cleaning comprises Argon.

6. The method of claim 1 wherein only Argon is used as a process gas used during the plasma cleaning.

7. The method of claim 1 wherein only Argon and Oxygen are used as a process gas used during the plasma cleaning.

8. The method of claim 1 wherein a plasma cleaning time is selected from the group consisting of 1, 3, and 5 minutes.

9. A method comprising:
   forming interconnection balls coupled to terminals;
   encapsulating the interconnection balls in a package body;
   forming via apertures through the package body to expose the interconnection balls, wherein a contamination is formed on the interconnection balls, the contamination comprising material of the package body; and
   removing the contamination.

10. The method of claim 9 wherein the removing the contamination comprises plasma cleaning the interconnection balls.

11. The method of claim 9 further comprising coupling an electronic component to a substrate, the terminals being coupled to the substrate.

12. The method of claim 11 wherein the encapsulating further comprises encapsulating the electronic component in the package body.

13. The method of claim 9 wherein the forming via apertures comprises laser-ablating the package body.

14. The method of claim 13 wherein a laser-ablated portion of the package body is redeposited as the contamination.

15. The method of claim 13 wherein a portion of the package body above the interconnection balls in not completely removed during the laser-ablating and remains as the contamination.

* * * * *

3UNITED STATES PATENT AND TRADEMARK OFFICE
CERTIFICATE OF CORRECTION

| | | |
|---|---|---|
| PATENT NO. | : 8,338,229 B1 | Page 1 of 1 |
| APPLICATION NO. | : 12/846973 | |
| DATED | : December 25, 2012 | |
| INVENTOR(S) | : Ludovico E. Bancod, Jin Seong Kim and Kurt Peter Wachtler | |

It is certified that error appears in the above-identified patent and that said Letters Patent is hereby corrected as shown below:

In the Claims:

In Column 8, Line 25, Claim 15, replace "in not" with --is not--.

Signed and Sealed this
Fourteenth Day of May, 2013

Teresa Stanek Rea
*Acting Director of the United States Patent and Trademark Office*